(12) United States Patent
Parks et al.

(10) Patent No.: US 9,772,347 B2
(45) Date of Patent: Sep. 26, 2017

(54) INTERCONNECTION METER SOCKET ADAPTERS

(71) Applicant: San Diego Gas & Electric Company c/o Sempra Energy, San Diego, CA (US)

(72) Inventors: Ken Parks, San Diego, CA (US); Michael Colburn, San Diego, CA (US)

(73) Assignee: SAN DIEGO GAS & ELECTRIC COMPANY, San Diego, CA (US)

( * ) Notice: Subject to any disclaimer, the term of this patent is extended or adjusted under 35 U.S.C. 154(b) by 147 days.

(21) Appl. No.: 14/796,902

(22) Filed: Jul. 10, 2015

(65) Prior Publication Data
US 2015/0309075 A1 Oct. 29, 2015

Related U.S. Application Data

(63) Continuation-in-part of application No. 14/472,269, filed on Aug. 28, 2014.
(Continued)

(51) Int. Cl.
*G01R 1/04* (2006.01)
*H01R 35/02* (2006.01)
(Continued)

(52) U.S. Cl.
CPC .............. *G01R 1/0416* (2013.01); *G01R 3/00* (2013.01); *H01R 33/94* (2013.01); *H01R 33/7635* (2013.01); *Y10T 29/49208* (2015.01)

(58) Field of Classification Search
CPC ......... G01R 11/00–11/66; G01R 1/00–1/0416; G01R 3/00; B60R 16/02; H01R 33/94;
(Continued)

(56) References Cited

U.S. PATENT DOCUMENTS 4,977,482 A * 12/1990 Langdon .................. H02B 1/03
324/156
5,572,396 A * 11/1996 Robinson ................. G01R 1/36
361/117
(Continued)

OTHER PUBLICATIONS

Patent Cooperation Treaty, International Search Report for PCT/US2016/041612, dated Dec. 2, 2016, pp. 1-4.

*Primary Examiner* — Huy Q Phan
*Assistant Examiner* — David Frederiksen
(74) *Attorney, Agent, or Firm* — Sheppard, Mullin, Richter & Hampton LLP (57) ABSTRACT

Interconnection meter socket adapters are provided. An interconnection meter socket adapter comprises a housing enclosing a set of electrical connections. The interconnection meter socket adapter may be configured to be coupled to a standard distribution panel and a standard electric meter, thereby establishing connections between a distribution panel and a user such that electrical power may be delivered to the user while an electrical meter measures the power consumption of the user. An interconnection meter socket adapter may be configured to be coupled to a DC-AC inverter, which may be coupled to various energy sources. As such, the energy sources are coupled to an electrical power system. In addition, a connector such as a flexible cable or flexible conduit containing insulated wires can be provided for connecting various energy sources and/or sinks.

15 Claims, 7 Drawing Sheets

Related U.S. Application Data (60) Provisional application No. 61/871,090, filed on Aug. 28, 2013.

(51) Int. Cl.
    *G01R 3/00*         (2006.01)
    *H01R 33/94*       (2006.01)
    *H01R 33/76*       (2006.01)

(58) Field of Classification Search
    CPC .......... H01R 31/02; H02J 3/383; H02J 3/386; H02B 1/03–1/0526
    See application file for complete search history.

(56) References Cited

U.S. PATENT DOCUMENTS

| | | | |
|---|---|---|---|
| 5,834,932 A | 11/1998 | May | |
| 5,894,422 A * | 4/1999 | Chasek | G01D 4/006 340/870.03 |
| 6,188,145 B1 | 2/2001 | Stewart | |
| 7,648,389 B1 * | 1/2010 | Scott | H01R 9/2491 439/517 |
| 7,994,934 B2 | 8/2011 | Kagan | |
| 8,368,386 B2 | 2/2013 | Reineccius | |
| 8,784,130 B2 * | 7/2014 | Scott | H01R 33/945 439/517 |
| 8,855,019 B2 | 10/2014 | Elliott et al. | |
| 9,047,074 B2 | 6/2015 | Pfeifer et al. | |
| 9,500,672 B1 | 11/2016 | Bautista et al. | |
| 2002/0171436 A1 * | 11/2002 | Russell | G01R 11/04 324/602 |
| 2005/0027464 A1 | 2/2005 | Jonker et al. | |
| 2009/0091291 A1 | 4/2009 | Woody et al. | |
| 2009/0108680 A1 * | 4/2009 | Minemura | H02J 9/005 307/104 |
| 2009/0124119 A1 | 5/2009 | Austin | |
| 2010/0003848 A1 * | 1/2010 | Scott | H01R 9/2491 439/517 |
| 2010/0128418 A1 | 5/2010 | Pruehs et al. | |
| 2010/0225305 A1 | 9/2010 | Reineccius | |
| 2011/0001356 A1 | 1/2011 | Pollack | |
| 2011/0010043 A1 | 1/2011 | Lafky | |
| 2011/0212648 A1 * | 9/2011 | Fish | G01R 11/17 439/517 |
| 2011/0237118 A1 * | 9/2011 | Feldman | H01R 33/945 439/517 |
| 2011/0248858 A1 * | 10/2011 | Onodi | H02H 7/261 340/635 |
| 2012/0097045 A1 * | 4/2012 | Kurimoto | F24C 7/087 99/331 |
| 2012/0191387 A1 | 7/2012 | Yamanaka et al. | |
| 2012/0229082 A1 | 9/2012 | Vukojevic et al. | |
| 2012/0276775 A1 | 11/2012 | Garwood et al. | |
| 2013/0020991 A1 * | 1/2013 | DeBoer | B60L 11/1838 320/109 |
| 2013/0026986 A1 | 1/2013 | Parthasarathy et al. | |
| 2014/0098470 A1 * | 4/2014 | Robinson | H02B 1/04 361/644 |
| 2014/0127935 A1 * | 5/2014 | Scott | H01R 33/945 439/517 |
| 2014/0218010 A1 | 8/2014 | Fulton et al. | |
| 2015/0061644 A1 | 3/2015 | Parks et al. | |
| 2016/0181752 A1 | 6/2016 | Parks et al. | |
| 2016/0232623 A1 | 8/2016 | Parks et al. | |
| 2016/0236634 A1 | 8/2016 | Parks et al. | |
| 2016/0238633 A1 | 8/2016 | Parks et al. | |
| 2016/0239035 A1 | 8/2016 | Parks et al. | |
| 2016/0247241 A1 | 8/2016 | Parks et al. | |
| 2016/0247242 A1 | 8/2016 | Parks et al. | |

\* cited by examiner

INTERCONNECTION METER SOCKET ADAPTERS

RELATED APPLICATIONS

This application is a continuation-in-part of U.S. patent application Ser. No. 14/472,269, filed on Aug. 28, 2014, which claims priority to U.S. Provisional Patent Application No. 61/871,090 filed on Aug. 28, 2013, the contents of both of which are incorporated herein by reference.

TECHNICAL FIELD

This disclosure relates generally to electrical components, and more particularly, some embodiments relate to interconnection meter socket adapters for connecting various energy sources and sinks (loads) to a power system without changing an existing distribution panel.

BACKGROUND

A distribution panel is the hub where an electrical power feed is divided into subsidiary circuits. Typically, distribution panels of different capacities (e.g., 150-Amp, 200-Amp, or 400-Amp) are installed to homes depending on their electrical usage needs. Power carried by the electrical power feed is distributed to the loads via the distribution panel. Therefore, an increased load that results in more electrical current flowing through the distribution panel may require changing an existing distribution panel to accommodate the current change (increase). Furthermore, with the emergence of renewable energy sources, a user that traditionally consumes electrical power may provide electrical power into a distribution grid at certain times. The additional circuit capacity required to accommodate this back feed of energy may exceed the current capacity of an existing distribution panel, requiring the existing distribution panel to be changed.

In many cases, there is no physical room in the distribution panel for more circuits. A distribution panel is usually limited to a certain amount of electrical circuits. New circuits may be added if there are unused breaker locations in the existing distribution panel; otherwise, the existing distribution panel needs to be replaced by a distribution panel with a larger capacity.

BRIEF SUMMARY OF THE EMBODIMENTS

Interconnection meter socket adapters are provided. Various embodiments of this disclosure may be under utility seal and ownership. Customer wiring behind the meter is avoided, which allows a utility company to own the connection all the way up to the disconnecting means. In one embodiment, an interconnection meter socket adapter comprises a housing enclosing a set of electrical connections. The interconnection meter socket adapter may be configured to be coupled to a standard distribution panel and a standard electrical meter. Various embodiments may establish connections between a distribution panel and a user such that electrical power may be delivered to the user while an electrical meter will still measure the power consumption of the user.

In addition, various embodiments are configured to be coupled to a DC-AC inverter, which may be coupled to various energy sources. As such, the energy sources are coupled to an electrical power system. In some embodiments, a connector such as a flexible cable (e.g., six feet) or flexible conduit containing insulated wires may be provided. Therefore, an interconnection meter socket adapter may be installed far enough away from a gas riser thereby meeting service standards. Further embodiments may comprise a measurement module for monitoring the bi-directional power flow through an interconnection meter socket adapter. That is, the power consumption of the user and/or an energy sink as well as the energy generation of an energy source may be monitored. The real-time data may be provided by a communication module and used for electrical power system planning purposes, and for other purposes.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. The figures are not drawn to scale. It should be understood that the disclosed technology can be practiced with modification and alteration, and that the disclosed technology be limited only by the claims and the equivalents thereof.

DETAILED DESCRIPTION OF THE EMBODIMENTS

Conventionally, when introducing renewable energy such as solar energy, fuel cells, wind energy, and energy storage, a DC-AC inverter is needed to convert the output of a renewable energy source to AC energy so that the energy source may be coupled to an electrical power system. This may cause a large amount of current back fed into a distribution power grid, which may require an existing distribution panel to be changed. Some existing technologies such as hard wired adapters are not allowed in many utility service areas as they do not meet service standards due to customer wiring behind the meter. There are also constraints and requirements related to gas meter sets that limit the use of adapters. In addition, these hard wired adapters require a professional, qualified electrician for removal or installation, and also lack the ability to monitor bi-directional power real time. Only the net amount between generation and consumption is measured.

Interconnection meter socket adapters are provided. Various embodiments may be under utility seal and ownership. Customer wiring behind the meter is avoided, which allows a utility company to own the connection all the way up to the disconnecting means. In one embodiment, an interconnection meter socket adapter comprises a housing enclosing a set of electrical connections. The interconnection meter socket adapter may be configured to be coupled to a standard distribution panel and a standard electrical meter. Various embodiments may establish connections between a distribution panel and a user such that electrical power may be delivered to the user while an electrical meter may still measure the power consumption of the user.

In addition, various embodiments are configured to be coupled to a DC-AC inverter, which may be coupled to various energy sources. As such, the energy sources are coupled to an electrical power system. In some embodiments, a connector such as a flexible cable (e.g., six feet) or flexible conduit containing insulated wires may be provided. Therefore, an interconnection meter socket adapter may be installed far enough away from a gas riser thereby meeting service standards. Further embodiments may comprise a measurement module for monitoring the bi-directional power flow through an interconnection meter socket adapter. That is, the power consumption of the user and/or an energy sink as well as the energy generation of an energy source may be monitored. The real-time data may be provided by a communication module and used for electrical power system planning purposes, and for other purposes.

Figure 1:
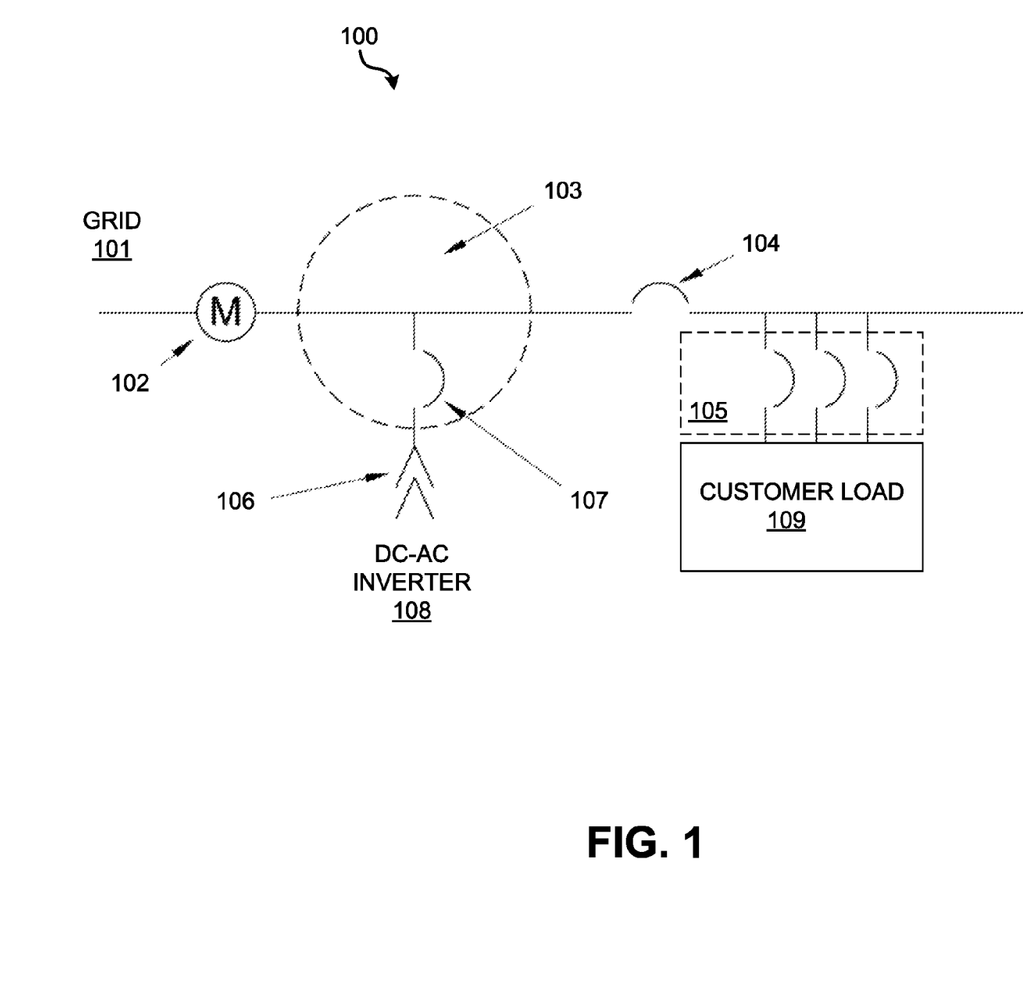
FIG. 1 is a diagram illustrating an example installation of an interconnection meter socket adapter, in accordance with embodiments disclosed herein.

FIG. 1 is a diagram illustrating an example installation 100 of an interconnection meter socket adapter 103, in accordance with an embodiment of the disclosure. In the illustrated example, a customer load 109 is coupled to a power distribution grid 101. As illustrated, the interconnection meter socket adapter 103 is installed between the utility revenue meter 102 and an existing customer main breaker 104. The interconnection meter socket adapter 103 may allow the energy source and the energy sink to connect to the power distribution grid 101 without changing the distribution panel.

The interconnection meter socket adapter 103 electrically bypasses the entire breaker and buswork section of a distribution panel. The interconnection meter socket adapter 103 is installed between existing main breaker 104 and the utility revenue meter 102. In various embodiments, the interconnection meter socket adapter 103 is cylindrical. An interconnection meter socket adapter 103 may mimic the connector arrangement of a revenue meter on one side, and the connector arrangement of the customer main panel on the other side. The interconnection meter socket adapter 103 may be installed under utility seals. The interconnection meter socket adapter 103 comprises a buswork internal to the cylinder that couples the customer load 109 to a tap on the load side of the utility revenue meter 102. Continuous connectivity is thereby maintained between the power distribution grid 101 and the customer's permanent main breaker 104 and the branch circuits of the customer distribution panel 105.

The interconnection meter socket adapter 103 may provide a separable connector 106. The connector 106 may include a flexible cable or flexible conduit containing insulated wires. The separable connector 106 couples the energy source and/or the energy sink to the power grid 101. A DC-AC inverter 108 is coupled to an energy source (e.g., solar energy, wind energy, or fuel cells) (not shown) and the separable connector 106, which is coupled to the interconnection meter socket adapter 103. By converting the DC energy generated by the energy source into AC energy, the DC-AC inverter 108 injects power flow into the power grid 101. In some embodiments, the separable connector 106 may also be coupled to an energy sink (e.g., an electric vehicle charging system). In some embodiments, an interconnection meter socket adapter 103 may comprise a breaker 107, which is coupled to the separable connector 106. The breaker 107 may be a resettable over current breaker protection device. The breaker 107 may be sized appropriately according to the National Electric Code (NEC).

In further embodiments, an interconnection meter socket adapter 103 may comprise a measurement module and a communication module. The communication module may be coupled to the measurement module. The measurement module may monitor the bidirectional power flow through the interconnection meter socket adapter 103. The measurement may be provided to a customer and/or a utility company for load and/or generation monitoring. The communication module may provide the measurement to a data collection device.

Figure 2A:
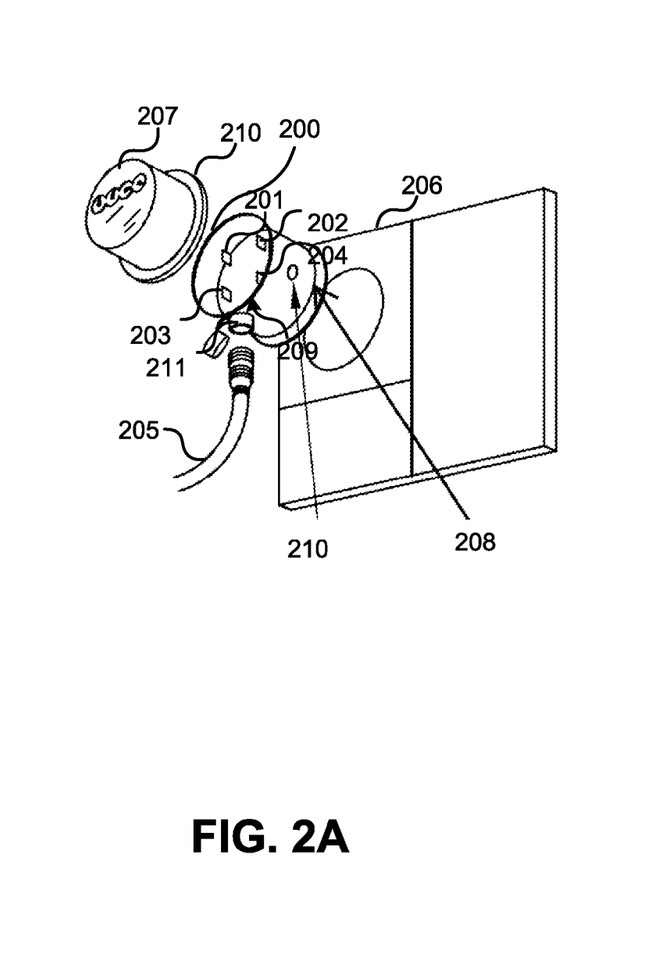
FIG. 2A illustrates an example interconnection meter socket adapter in accordance with an embodiment, in accordance with embodiments disclosed herein.
Figure 2B:
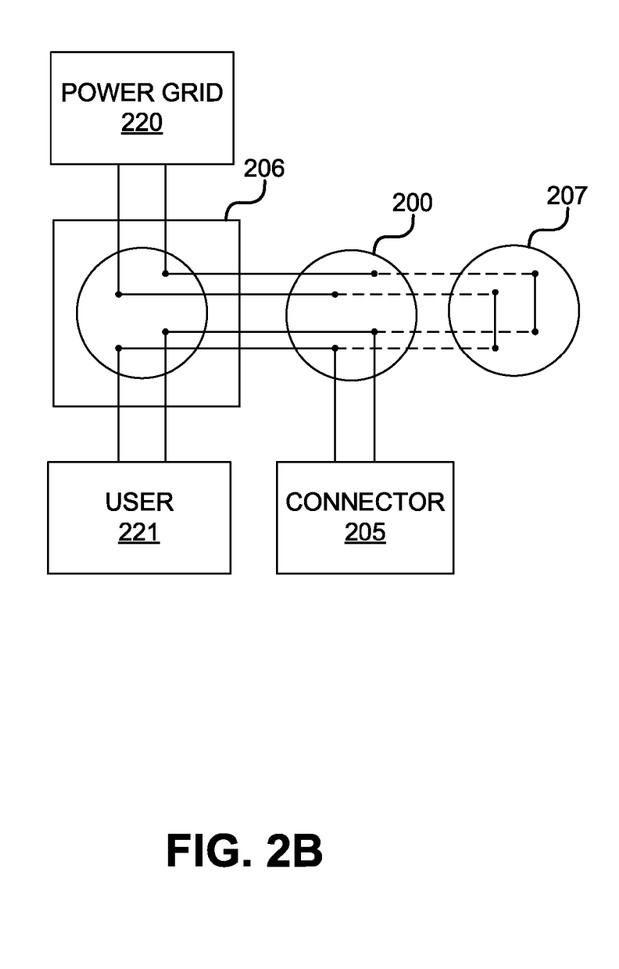
FIG. 2B illustrates an example circuit diagram of an interconnection meter socket adapter in a load-side configuration, in accordance with embodiments disclosed herein.

FIG. 2A-2B illustrates an exemplary interconnection meter socket adapter as well as its circuit diagram in accordance with an embodiment. FIG. 2A illustrates an exemplary interconnection meter socket adapter 200 in accordance with an embodiment. The interconnection meter socket adapter 200 may be installed physically between a meter 207 and a distribution panel 206. By way of example, the meter 207 may be a standard electricity meter that is either analog or digital. The meter 207 may be installed (e.g., plugged into) the distribution panel 206 directly. The interconnection meter socket adapter 200 may establish physical connectivity between the distribution panel 206, the meter 207, and a customer, such that the customer side of the meter 207 is tapped. During operation, the meter 207 may still measure the energy consumption of a user. In some embodiments, the meter 207 may be plugged into the interconnection meter socket adapter 200 rather than being plugged into the distribution panel 206. The interconnection meter socket adapter 200 comprises a set of jaw blades 201-204 (shown in FIG. 3B), wherein each of the jaw blades 201-204 electrically couples to a corresponding contact clip disposed on the surface of the distribution panel 206. The interconnection meter socket adapter 200 also comprises a set of sockets (shown in FIG. 3A), each socket contacting a corresponding clip, jaw blade or other contact of the meter 207.

The interconnection meter socket adapter 200 is cylindrical and comprises flanges 208-209 (shown in FIG. 2A). In the illustrated example, the flange 208 is covered by a ring, together fixing the interconnection meter socket adapter 200 to the distribution panel 206, when the meter socket adapter 200 is plugged into the distribution panel 206. The flange 209 and the ring 210 of the meter 207 fix the meter 207 to the interconnection meter socket adapter 200. In addition, the interconnection meter socket adapter 200 may include a coupler 211 to which a connector 205 may be coupled. In the illustrated example, the coupler 211 is a receptacle to the connector 205. In various embodiments, the connector 205 is a flexible cable or flexible conduit of various lengths containing insulated conductors. One end of the connector 205 is coupled to the interconnection meter socket adapter 200 and the other end is coupled to the energy source or the energy sink. As such, the energy source or an energy sink is coupled to the power grid via the interconnection meter socket adapter 200 without changing the distribution panel 206.

FIG. 2B is an example circuit diagram of an interconnection meter socket adapter 200. As illustrated, two phase wires (typically energized at 240 volts) couple the power grid 220 to the user 221 via a distribution panel 206. Further, the connector 205, which may be coupled to an energy source or an energy sink, is coupled to the interconnection meter socket adapter 200. By installing the interconnection meter socket adapter 200 to the distribution panel 206, the connector 205 and the user 221 are coupled in parallel, both of which may be coupled to the power grid 220. By installing the meter 207 to the interconnection meter socket adapter 200, the connector 205 and the user 221 are coupled to the power grid 220. The interconnection meter socket adapter 200 is plugged into the distribution panel 206 thereby making connections to the incoming wires from the power grid 220. In various embodiments, such connections are established by fitting a set of jaw blades of the interconnection meter socket adapter 200 into the corresponding contact clip in the distribution panel 206. The meter 207 is plugged into the interconnection meter socket adapter 200 thereby making connections to the incoming wires from a power grid 220 and the user 221 as well as the connector 205. In various embodiments, such connections are established by fitting a set of jaw blades on meter 207 into corresponding contact clip in the interconnection meter socket adapter 200.

Within the housing of the interconnection meter socket adapter 200, a set of connections are provided. When installed, the set of connections enable an energy source and/or an energy sink to be installed in parallel with an user such that no change is required in the distribution panel. In various embodiments, the connector 205 may be a flexible cable or flexible conduit containing insulated conductors serving as an interface for a solar inverter output. The solar inverter may be disconnected in case of the need for panel or meter service.

Figure 3A:
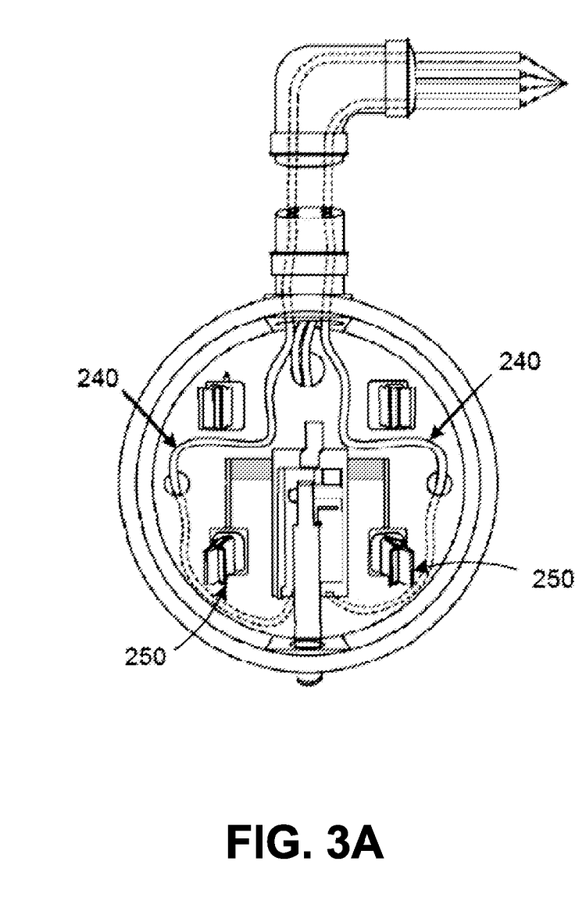
FIG. 3A is a front view illustrating the electrical wiring of the interconnection meter socket adapter of FIG. 2A, in accordance with embodiments disclosed herein.
Figure 3B:
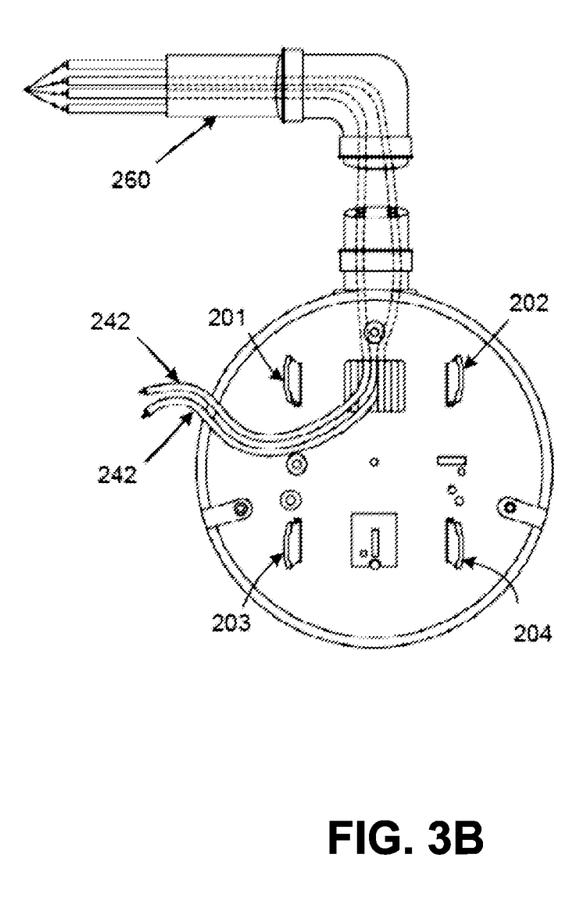
FIG. 3B is a rear view illustrating the electrical wiring of the interconnection meter socket adapter of FIG. 2A, in accordance with embodiments disclosed herein.

FIGS. 3A-3B are front and rear views, respectively, illustrating the electrical wiring of the interconnection meter socket adapter 200 in accordance with an embodiment. As illustrated, four wires enter the interconnection meter socket adapter 200 including two phase wires 240, a neutral wire 242, and a ground wire 244. Phase wires 240 terminate in clips 250 that connect with jaw blades 203 and 204. Typically, phase wires 240 are energized at 240V. Neutral wire 242 and ground wire 244 terminate on the customer's electrical panel ground bus. The interconnection meter socket adapter 200 can include a flexible conduit 260 that protects of the wires from ambient conditions.

Figure 4:
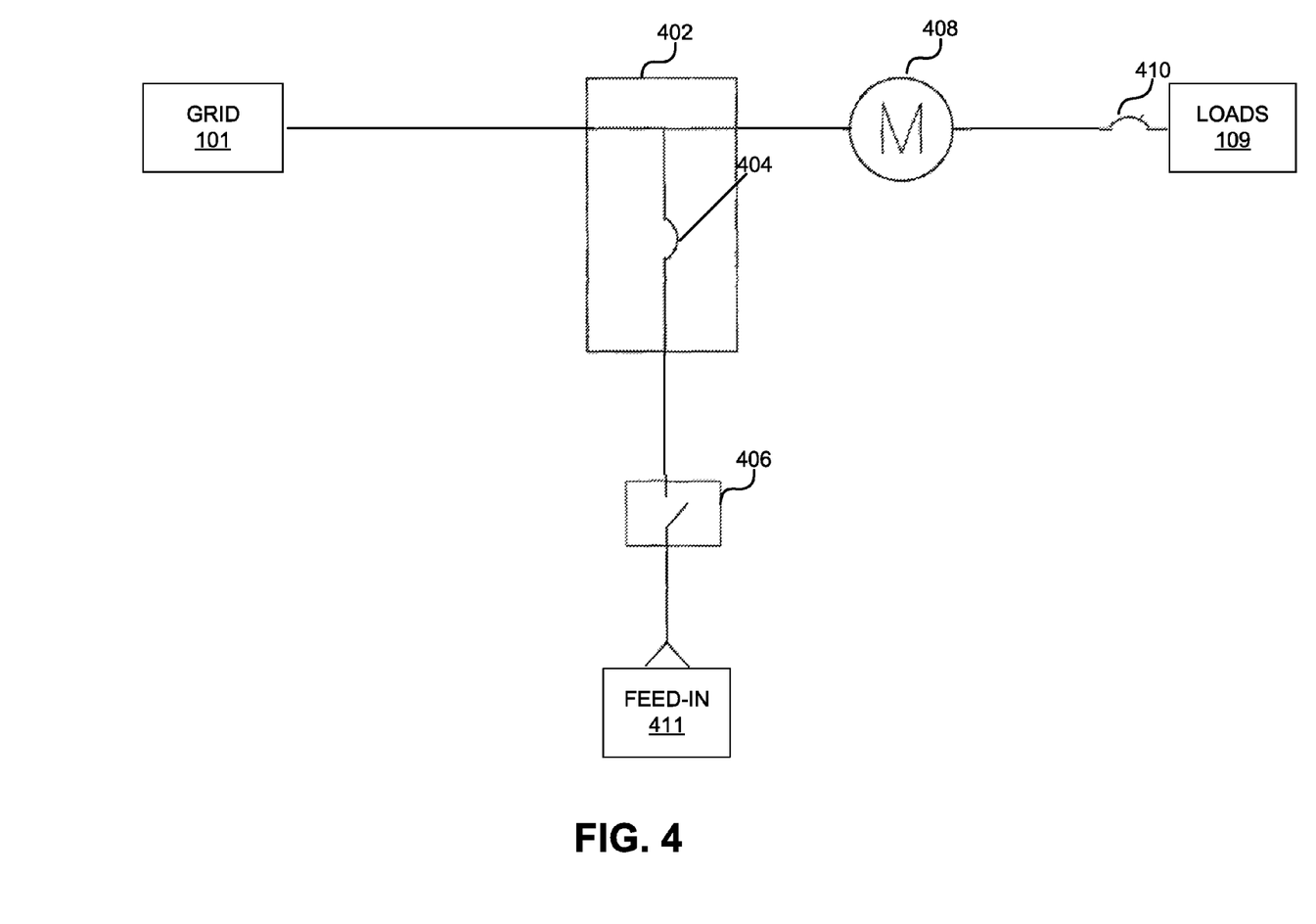
FIG. 4 is an one-line diagram illustrating an example installation of an interconnection meter socket adapter with a line side connection at the meter, in accordance with embodiments disclosed herein.

FIG. 4 is a diagram illustrating an example installation of an interconnection meter socket adapter 402. In the illustrated example, the customer load 109 is coupled to the power system distribution grid 101. As illustrated, the interconnection meter socket adapter 402 is installed between the utility revenue meter 408 and power grid 101, in contrast to the embodiment illustrated in FIG. 1 wherein the interconnection meter socket adapter is installed between the utility revenue meter 102 and the customer's distribution panel 105. In either embodiment, the interconnection meter socket adapter 402 may allow an energy source or an energy sink 411 to connect to the power grid 101 without updating the distribution panel.

Referring still to FIG. 4 and the embodiment illustrated therein, the interconnection meter socket adapter 402 electrically bypasses the entire breaker and buswork section of a distribution panel. The interconnection meter socket adapter 402 may be cylindrical and may mechanically couple to the distribution panel on one side, and to the utility revenue meter on the other side. An interconnection meter socket adapter 402 may mimic the connector arrangement of a revenue meter on one side, and the connector arrangement of the customer main panel on the other side, and may be installed under utility seals.

In some examples, the interconnection meter socket adapter 402 includes a set of jaw blades configured to make contact with the distribution panel, such that the interconnection meter socket adapter may be easily coupled to contact clips in the distribution panel, and may similarly couple to the utility revenue meter 408. The interconnection meter socket adapter 402 may also incorporate an electrical coupler configured to accept a connector. The electrical coupler, for example, may mechanically attach to a side collar of the interconnection meter socket adapter's housing, and in the present embodiment, may also detachably couple to a connector. The electrical coupler, when attached to the connector, also electrically couples the connector to the line side of the interconnection meter socket adapter 402. Interconnection meter socket adapter 402 may also include a breaker coupled between the electrical coupler and the meter.

The connector may, for example, include a cable harness that may couple to an energy source or an energy sink. For example, an energy source may be a renewable energy source, such as solar electric, wind or fuel cell energy production systems, or an energy storage system, that couple to the electrical coupler through a DC-AC inverter. The energy source may also be a conventional generator, or other non-renewable energy source.

The interconnection meter socket adapter 402 may further include a measurement module configured to measure power flow through the interconnection meter socket adapter. For example, the measurement module may include a voltage meter, and/or other electrical measurement devices. The measurement module may also include a processor and a memory module to store voltage and other measurements, and to generate a signal if power flow reaches a predetermined threshold value. The measurement module may further include a communications module that may transmit the signal to a receiver unit. For example, the communications module may be logically coupled, via a wire harness, to the utility revenue meter 408. Alternatively, the communications module may transmit a wireless signal via cellular, Wi-Fi, Bluetooth®, Zigbee, or other wireless communications protocol to a remote receiver unit, and ultimately a computer server, workstation, tablet, laptop, or handheld device.

Figure 5:
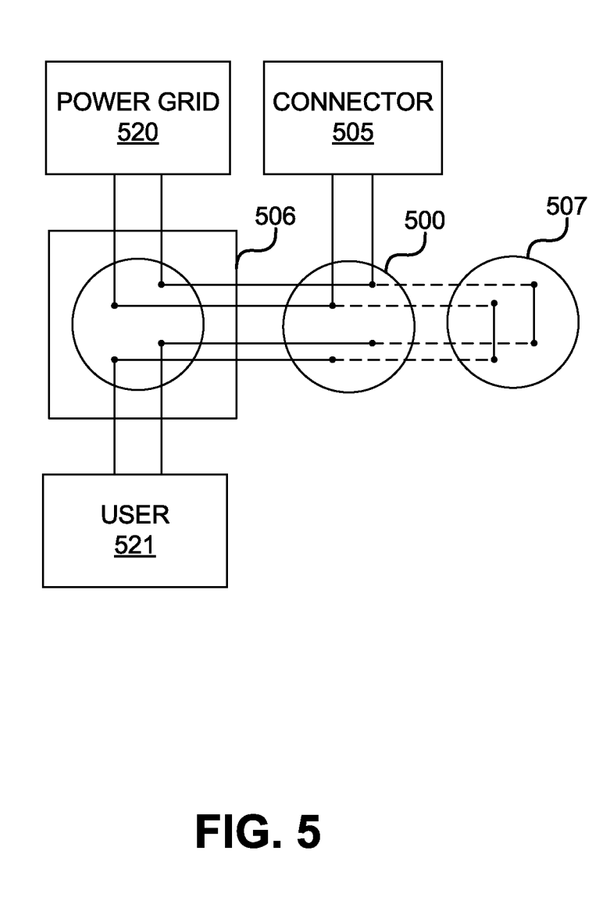
FIG. 5 illustrates an example circuit diagram of an interconnection meter socket adapter with a line-side configuration, in accordance with embodiments disclosed herein.

FIG. 5 illustrates an example circuit diagram of an interconnection meter socket adapter with a line-side configuration. As illustrated, two phase wires (typically energized at 240 volts) couple the power grid 520 to the user 521 via a distribution panel 506. Further, the connector 505, which may be coupled to an energy source or an energy sink, is coupled to the interconnection meter socket adapter 500. In the embodiment illustrated in FIG. 5, the connector 505 couples to the power grid side (i.e., the line side) of the interconnection meter socket adapter 500, in contrast to the embodiment illustrated in FIG. 2B in which the connector 205 couples to the user (load) side of interconnection meter socket adapter 200. As illustrated in FIG. 5, a set of electrical connections are disposed within the housing of interconnection meter socket adapter 500, wherein an input side of the set of electrical connections electrically couples an input side of the distribution panel 506 to an utility side of the utility revenue meter 507 in parallel, and an output side of the set of electrical connections electrically couples an output side of the distribution panel 506 to a customer side of the utility revenue meter 507 in parallel.

Still referring to FIG. 5, interconnection meter socket adapter 500 is plugged into the distribution panel 506 thereby making connections to the incoming wires from the power grid 520. In various embodiments, such connections are established by fitting a set of jaw blades of the interconnection meter socket adapter 200 into the corresponding contact clips in the distribution panel 206. The utility revenue meter 507 is plugged into the interconnection meter socket adapter 500 thereby making connections to the incoming wires from a power grid 520 and the user 521 as well as the connector 505. In various embodiments, such connections are established by fitting a set of jaw blades on utility revenue meter 507 into corresponding contact clips in the interconnection meter socket adapter 500.

When installed, the set of electrical connections permit an energy source and/or an energy sink to be installed in parallel with an user such that no change is required in the distribution panel. In various embodiments, the connector 505 may be a flexible cable or flexible conduit containing insulated conductors serving as an interface for a renewable energy source (e.g., a solar inverter, or other renewable energy source as disclosed herein).

Figure 6:
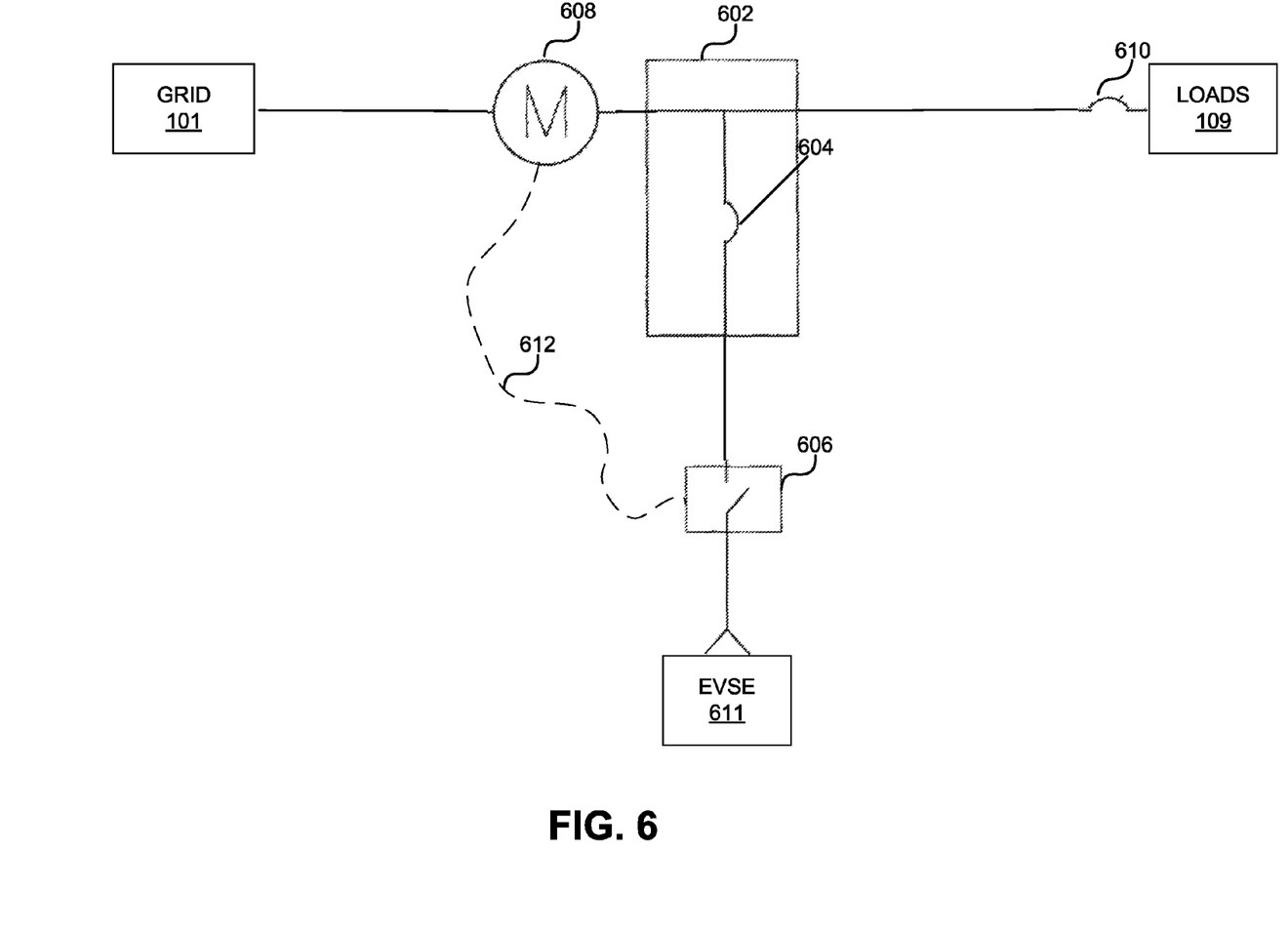
FIG. 6 is a diagram illustrating an example installation of an interconnection meter socket adapter coupled to an electrical sink, in accordance with embodiments disclosed herein.

FIG. 6 is a diagram illustrating an example installation of an interconnection meter socket adapter for an electrical sink (e.g., an electrical vehicle battery charger). In the illustrated example, the customer load 109 is coupled to the power system distribution grid 101. As illustrated, the interconnection meter socket adapter 602 is installed between the utility revenue meter 608 and the customer load 109, for example, by way of a distribution panel (not shown). The interconnection meter socket adapter 602 may include a breaker 604, and may couple through a power regulation module 606 to an energy sink 611. For example, energy sink 611 may be an electric vehicle battery charger, a stationary "whole house" battery, or other energy sink (load) as would be understood in the art.

Still referring to FIG. 6, power regulation module 606 may be configured to regulate power flow to energy sink 611. For example, power regulation module 606 may include a switch to disconnect power to the energy sink 611. Alternatively (or in addition to the switch), power regulation module 606 may incorporate a limiter, or other power regulation means as known in the art, to selectively reduce or increase power flow to energy sink 611. Power regulation module 606 may communicate with utility revenue meter 608 via a wireless or wired communications link 612.

In some examples, power regulation module 606 may include a measurement module configured to measure net power flow through the interconnection meter socket. For example, the measurement module may be a voltage meter, or other power measurement device as known in the art. The measurement module may also include a processor and a memory to store power measurements, and store a predetermined threshold value (e.g., based on a maximum net power flow based on the rating of the customer's main panel). For example, the threshold may be between 70% and 90% of a main panel rating.

The measurement module may further incorporate a communications module (e.g., hard wired, cellular, Wi-Fi, Bluetooth®, or other wireless protocol as known in the art). In some examples, when the net power usage measured by the measurement module exceeds the threshold value, the measurement module may transmit a suspend signal through the communications module. The suspend signal may then be received by the power regulation module 606 to reduce or suspend power flow to energy sink 611. For example, power regulation module 606 may open the switch between the interconnection meter socket adapter 602 and the energy sink 611. When net power flow reduces over time (for example, the power draw by the customer load 109), such that it falls below a second, lower threshold value, the measurement module may transmit a resume signal through the communications module. The power regulation module 606 may then receive the resume power flow signal to the energy sink 611 (for example, by closing the switch). By regulating power in this way, the interconnection meter socket adapter 602 may avoid exceeding NEC equipment ratings when operating electrical appliances at the same time as, for example, charging an electric vehicle battery while also running a major appliance.

Figure 7:
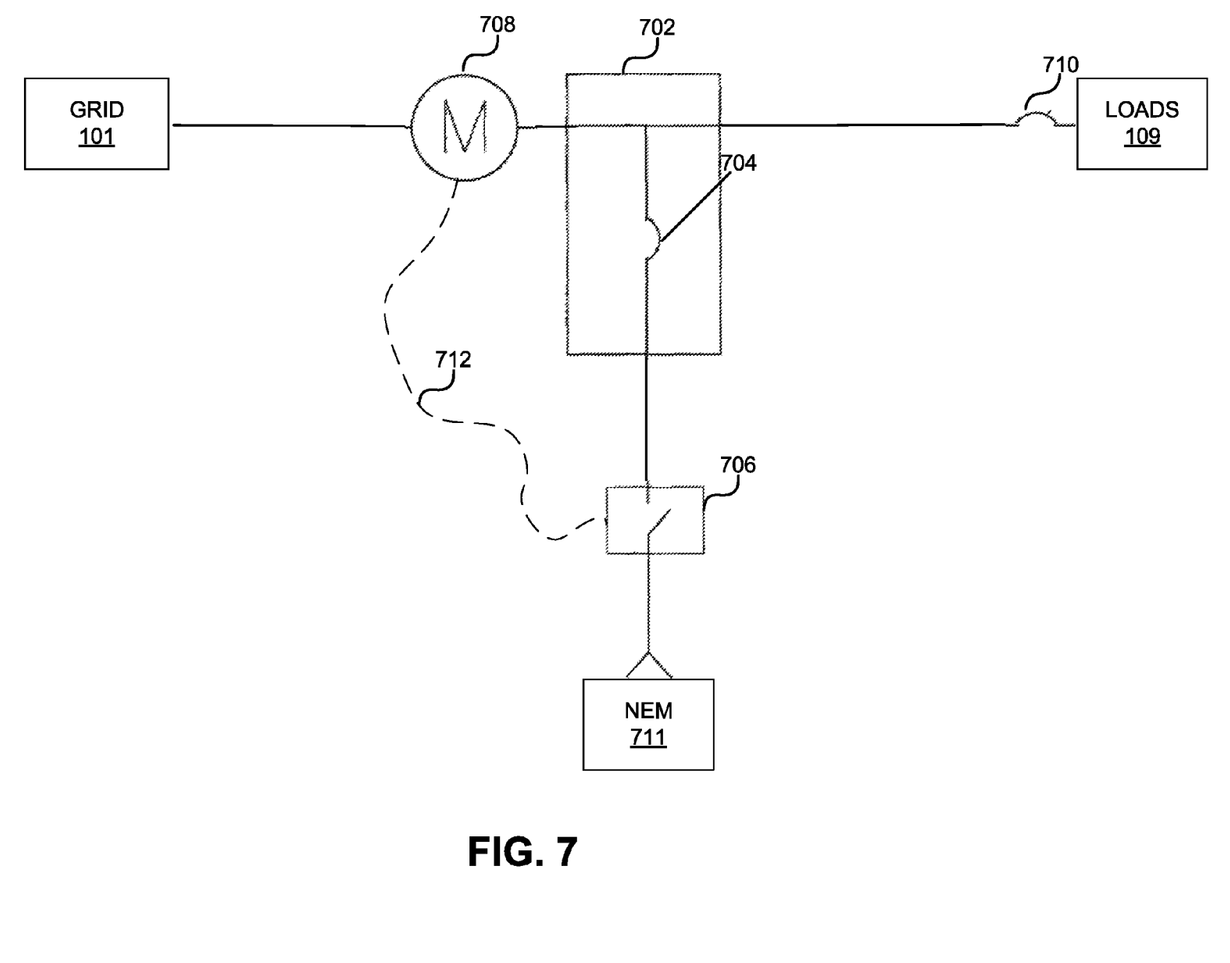
FIG. 7 is a diagram illustrating an example installation of an interconnection meter socket adapter providing telemetered data from renewable distribution resources, in accordance with embodiments disclosed herein.

FIG. 7 is a diagram illustrating an example installation of an interconnection meter socket adapter providing telemetered data from renewable distribution resources. In the illustrated example, the customer load 109 is coupled to the power system distribution grid 101. As illustrated, the interconnection meter socket adapter 702 is installed between the utility revenue meter 708 and the customer load 109, for example, by way of a distribution panel (not shown). The interconnection meter socket adapter 702 may include a breaker 704, and may couple through a power regulation module 706 to a net-metering measurement module 711, which may in turn, couple to an energy source. For example, the energy source may be a renewable energy source, such as a solar panel and inverter, a net-metering measurement module electrically coupled to the connector and configured to measure power produced by the renewable energy power source. Power regulation module 706 may communicate with utility revenue meter 708 via a wireless or wired communications link 712.

The net-metering measurement module may include a communications module configured to transmit a data set indicating a measurement of power produced by the renewable energy power source to a receiving unit. For example, the receiving unit may be installed at the utility company to facilitate measurements and energy production generation statistics that may be used for purchased power agreement and other customers. Similarly, the received measurement data may be used for resource planning, or to alert customers of power generation performance of the customer's renewable energy source. The communication module may include a cellular, Wi-Fi, or Bluetooth® transmitter, or other wireless technology as known in the art.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to execute the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An interconnection meter socket adapter, comprising:
   a housing having a first side coupled to a meter and a second side coupled to a surface of a distribution panel;
   a set of electrical connections disposed within the housing, wherein an input side of the set of electrical connections electrically couples an input side of the distribution panel in parallel with an utility side of the meter, and an output side of the set of electrical connections electrically couples an output side of the distribution panel in parallel with a customer side of the meter;
   a set of sockets supported by the housing, and configured to electrically couple to the utility side of the meter and the input side of the set of electrical connections; and
   a measurement module configured to measure net power flow through the interconnection meter socket, to transmit a suspend signal if the net power flow exceeds a threshold, and to send a restore signal if the net power flow falls below a second threshold.

2. The interconnection meter socket adapter of claim 1, further comprising a set of jaw blades configured to electrically couple to a set of corresponding contact clips disposed on the surface of the distribution panel.

3. The interconnection meter socket adapter of claim 1, wherein the housing further comprises an electrical coupler configured to accept a connector.

4. The interconnection meter socket adapter of claim 3, further comprising a breaker coupled between the electrical coupler and the meter.

5. The interconnection meter socket adapter of claim 4, wherein the connector electrically couples to an energy source or an energy sink.

6. The interconnection meter socket adapter of claim 4, wherein the connector electrically couples to a direct current-alternating current inverter.

7. The interconnection meter socket adapter of claim 6, further comprising a communication module coupled to the measurement module, wherein the communication module is configured to transmit a signal indicating measured power flow to a receiving unit.

8. An interconnection meter socket adapter, comprising:
   a housing having a first side coupled to a meter and a second side coupled to a distribution panel;
   a set of electrical connections disposed within the housing, wherein an input side of the set of electrical connections electrically couples an input side of the distribution panel in parallel with an utility side of the meter, and an output side of the set of electrical connections electrically couples an output side of the distribution panel in parallel with a customer side of the meter;
   a set of sockets supported by the housing, and configured to electrically couple to the customer side of the meter and the output side of the set of electrical connections;

an electrical connector configured to electrically couple to the set of sockets, wherein the electrical connector couples through a power regulation module to an electrical load; and a measurement module configured to measure net power flow through the interconnection meter socket, wherein the measurement module communicatively couples to the power regulation module and is configured to transmit a suspend signal to the power regulation module if the net power flow exceeds a threshold, wherein the power regulation module is configured to suspend power flow to the electrical load based on the suspend signal, wherein the measurement module is configured to send a restore signal to the power regulation module if the net power flow falls below a second threshold, and the power regulation module is configured to restore power flow to the electrical load based on the restore signal.

9. The interconnection meter socket adapter of claim 8, wherein the power regulation module comprises a switch coupling an input side of the power regulation module to an output side of the power regulation module, and the power regulation module is configured to open the switch based on the suspend signal.

10. The interconnection meter socket adapter of claim 8, wherein the threshold is between 70% and 90% of a main panel rating.

11. The interconnection meter socket adapter of claim 8, wherein electrical load is an electric vehicle battery charger.

12. A system for net-metering, comprising:
a set of electrical connections disposed within a housing, wherein an input side of the set of electrical connections electrically couples an input side of the distribution panel in parallel with an utility side of the meter, and an output side of the set of electrical connections electrically couples an output side of the distribution panel in parallel with a customer side of the meter;
a set of sockets supported by the housing, and configured to electrically couple to the customer side of the meter and the output side of the set of electrical connections;
an electrical connector configured to electrically couple the set of sockets to a renewable energy power source through an direct current-alternating current inverter; and
a net-metering measurement module electrically coupled to the connector and configured to measure net power flow through the sockets, to transmit a suspend signal if the net power flow exceeds a threshold, and to send a restore signal if the net power flow falls below a second threshold.

13. The system of claim 12, wherein the renewable energy power source comprises a solar-electric power source.

14. The system of claim 12, wherein the net-metering measurement module comprises a communications module configured to transmit a data set indicating a measurement of power produced by the clean energy power source to a receiving unit.

15. The system of claim 14, wherein the communication module comprises a cellular, Wi-Fi®, or Bluetooth® transceiver.

* * * * *